(12) United States Patent
Starostine et al.

(10) Patent No.: US 9,117,663 B2
(45) Date of Patent: Aug. 25, 2015

(54) METHOD AND DEVICE FOR MANUFACTURING A BARRIER LAYER ON A FLEXIBLE SUBSTRATE

(75) Inventors: Serguei Starostine, Tilburg (NL); Hindrik De Vries, Tilburg (NL)

(73) Assignee: Fujifilm Manufacturing Europe BV (NL)

( * ) Notice: Subject to any disclaimer, the term of this patent is extended or adjusted under 35 U.S.C. 154(b) by 0 days.

(21) Appl. No.: 14/126,572

(22) PCT Filed: Apr. 24, 2012

(86) PCT No.: PCT/GB2012/050897
§ 371 (c)(1),
(2), (4) Date: Jan. 28, 2014

(87) PCT Pub. No.: WO2012/172304
PCT Pub. Date: Dec. 20, 2012

(65) Prior Publication Data
US 2014/0138802 A1    May 22, 2014

(30) Foreign Application Priority Data
Jun. 16, 2011   (GB) .................................. 1110117.7

(51) Int. Cl.
*H01L 21/3105* (2006.01)
*H01L 21/02* (2006.01)
(Continued)

(52) U.S. Cl.
CPC ........ *H01L 21/02247* (2013.01); *C23C 16/401* (2013.01); *C23C 16/56* (2013.01); *H01J 37/32018* (2013.01); *H01L 29/408* (2013.01)

(58) Field of Classification Search
CPC ................... H01L 21/02203; H01L 21/02332; H01L 21/02362

USPC .................................................. 438/783, 792
See application file for complete search history.

(56) References Cited

U.S. PATENT DOCUMENTS 6,774,569 B2    8/2004   de Vries et al.
7,132,373 B2   11/2006   Fukuhisa et al.
(Continued)

FOREIGN PATENT DOCUMENTS

EP    2226832 A1    9/2010
JP    4249520 A    10/2004

OTHER PUBLICATIONS

Nakae, Mari, et al., "The comparison of the growth models of silicon nitride ultrathin films fabricated using atmospheric pressure plasma and radio frequency plasma," Journal of Applied Physics, Jan. 22, 2007, pp. 023513-1-023513-4, vol. 101, American Institute of Physics.
(Continued)

*Primary Examiner* — George Fourson, III
(74) *Attorney, Agent, or Firm* — Banner & Witcoff, Ltd.

(57) ABSTRACT

The invention provides a method for manufacturing a barrier layer on a substrate, the method comprising: —providing a substrate with an inorganic oxide layer having a pore volume between 0.3 and 10 vol. %; —treating said substrate with an inorganic oxide layer in a glow discharge plasma, said plasma being generated by at least two electrodes in a treatment space formed between said two electrodes, said treatment space also being provided with a gas comprising Nitrogen compounds; and —the treating of the substrate in said treatment space is done at a temperature below 150° C., e.g. below 100° C. The invention further provides a device for manufacturing a barrier layer on a substrate.

16 Claims, 3 Drawing Sheets

(51) Int. Cl.
  *C23C 16/40* (2006.01)
  *C23C 16/56* (2006.01)
  *H01J 37/32* (2006.01)
  *H01L 29/40* (2006.01)

(56) References Cited

U.S. PATENT DOCUMENTS

| | | | |
|---|---|---|---|
| 7,226,871 | B2 | 6/2007 | Chou et al. |
| 7,399,944 | B2 | 7/2008 | DeVries et al. |
| 7,491,429 | B2 | 2/2009 | De Vries et al. |
| 7,619,356 | B2 | 11/2009 | Son et al. |
| 7,791,281 | B2 | 9/2010 | Aldea et al. |
| 7,838,092 | B2 | 11/2010 | Iwanaga et al. |
| 7,898,082 | B2 | 3/2011 | Moon |
| 7,969,095 | B2 | 6/2011 | De Vries et al. |
| 2004/0011764 | A1 | 1/2004 | De Vries et al. |
| 2005/0003660 | A1* | 1/2005 | Murakawa et al. ........... 438/643 |
| 2005/0017364 | A1* | 1/2005 | Iba ................. 257/758 |
| 2006/0148140 | A1 | 7/2006 | Chou et al. |
| 2007/0026243 | A1 | 2/2007 | Iwanaga et al. |
| 2008/0242118 | A1* | 10/2008 | Dimitrakopoulos et al. .. 438/799 |
| 2009/0280637 | A1* | 11/2009 | Lee et al. ....................... 438/618 |
| 2011/0014424 | A1 | 1/2011 | De Vries et al. |
| 2011/0101532 | A1* | 5/2011 | Pohl et al. ..................... 257/758 |
| 2011/0147882 | A1* | 6/2011 | Tsutsue .......................... 257/506 |

OTHER PUBLICATIONS

Peng, Hua-Gen, et al., "Pore Sealing by NH3 Plasma Treatment of Porous Low Dielectric Constant Films," Journal of The Electrochemical Society, pp. G85-G94, vol. 154, issue 4, ECS—The Electrochemical Society.

* cited by examiner

METHOD AND DEVICE FOR MANUFACTURING A BARRIER LAYER ON A FLEXIBLE SUBSTRATE

RELATED APPLICATION DATA

This application is a National Stage Application under 35 U.S.C. 371 of co-pending PCT application PCT/GB2012/050897 designating the United States and filed Apr. 24, 2012; which claims the benefit of GB 1110117.7, filed Jun. 16, 2011 each of which are hereby incorporated by reference in their entireties.

TECHNICAL FIELD

The invention relates to a method for manufacturing a barrier layer on a substrate. The present invention further relates to a device for manufacturing such a barrier layer. In addition the invention relates to a substrate having an inorganic oxide barrier layer.

BACKGROUND

Nitridation techniques using a nitrogen plasma have been widely studied for application to integrated electronics devices such as gate insulators of metal oxide semiconductor field effect transistors.

For example U.S. Pat. No. 7,619,356 describes an anode for an OLED device wherein the anode comprises an Indium Tin Oxide (ITO) film on a glass substrate and the ITO surface is being treated in a plasma treatment at low pressure (14 mTorr) at 50 W power for 5 minutes. As a result of this treatment 13.3% nitrogen atoms are observed from the surface, which amount corresponds to about 275 oxygen atoms.

U.S. Pat. No. 7,132,373 discloses a method for producing a crystalline metal oxide film (for example a film containing ITO) using a nitrogen or oxygen plasma at a low pressure (50-100 Pa) for at least 3 minutes.

U.S. Pat. No. 7,898,082 discloses a semiconductor device having a barrier metal nitride layer, the layer formed using a nitrogen plasma at high temperatures of 350-750 degrees Celsius.

Furthermore, Nakae et al describes in the Journal of Applied Physics 101, 023513 (2007) the grow models of silicon nitride ultrathin films fabricated using atmospheric pressure plasma on Si-wafers. In case of nitridation with an RF plasma this was done at a low gas pressure of $1.0*10^{-5}$ Torr.

JP 4 249 520 discloses the improvement of using a nitridation step with an Argon and Nitrogen plasma treatment at low pressure.

In many manufacturing processes involving glass substrates, such as the process of manufacturing OLED devices, there is a desire to replace glass substrates with low weight, flexible polymeric substrates using polymers with a very thin amorphous layer of metal oxide with improved barrier properties.

It is an object of the invention to provide a method for creating an improved barrier on a substrate, in particular a flexible substrate.

SUMMARY OF THE INVENTION

According to a present invention embodiment, a method is provided for manufacturing a barrier layer on a substrate, the method comprising:

providing a substrate with an inorganic oxide layer having a pore volume between 0.3 and 10 vol. %;

treating said substrate with an inorganic oxide layer in a glow discharge plasma, said plasma being generated by at least two electrodes in a treatment space formed between said two electrodes, said treatment space also being provided with a gas comprising Nitrogen compounds; and the treating of the substrate in said treatment space is done at a temperature below 150° C., e.g. below 100° C.

In an embodiment, the treatment is done until a barrier with a top layer comprising between 1 to 3% Nitrogen-atom concentration is formed on the substrate.

In an embodiment the generated plasma is a high frequency or radio frequency (RF) plasma or discharge.

In an embodiment, the gas comprising Nitrogen compounds comprises $N_2$ (nitrogen) and/or $NH_3$ (ammonia) and/or NO.

In an embodiment, the gas comprising Nitrogen compounds has a pressure between 0.1 and 10 atmosphere, e.g. between 0.5 and 5 atmosphere (between $5\times10^4$ Pa and $5\times10^5$ Pa), e.g. between 0.6 and 2 atmosphere (between $6\times10^4$ Pa and $2\times10^5$ Pa), e.g. substantially 1 atmosphere. At these pressures, typically higher than used in the prior art, the barrier is advantageously formed in less time.

In an embodiment, the treating of the substrate in said treatment space is done for a duration of less than 20 minutes, e.g. less than 10 minutes. Given the conditions outlined above, this is enough time to form a suitable barrier layer, in particular a barrier having a top layer with 1 to 3% Nitrogen atom concentration.

In an embodiment, the substrate is a flexible substrate, in particular a flexible polymeric substrate. In a further embodiment, the electrodes are roll-electrodes, and the flexible layer is moved through the treatment space at a linear speed.

In an embodiment, the inorganic oxide layer of the provided substrate is an silicon-oxide layer.

In an embodiment, the top layer of the barrier that is formed is between 5 and 15 nm, e.g. between 7 and 12 nm, thick.

The invention further provides a device for manufacturing a barrier layer on a substrate, the device comprising:

at least two electrodes, arranged to generate a glow discharge plasma in a treatment space formed between said two electrodes;

a gas supply device, arranged to provide a gas comprising Nitrogen compounds to the treatment space;

wherein the treatment space if further arranged to hold and treat at least one substrate having an inorganic oxide layer, and the device is arranged for treating of the substrate in said treatment space at a temperature below 150° C., e.g. below 100° C. The device can further have any of the previously mentioned features of embodiments of the invention.

The invention further provides a substrate having a barrier layer, the barrier layer comprising an inorganic oxide layer originally, that is, prior to a nitridation step, having a pore size between 0.3 and 10 vol. %, the inorganic oxide layer further having a top layer comprising between 1 to 3% Nitrogen-atom concentration. The substrate and/or the barrier layer may further have any of the abovementioned substrate and/or barrier layer features.

The method and device described in this invention gives a remarkable improvement, which is not known from the prior art, using a nitridation step at atmospheric pressure and relatively low temperatures resulting in a product having a small amount concentration N-atoms built-in in the metal oxide surface. The method and device according the invention thus allows the manufacturing of an excellent barrier film, wherein said film may essentially consist of a flexible substrate having a thin inorganic oxide layer having a pore volume from e.g. 0.1 to 20 volume %, e.g. 0.3 to 10 volume %. The method can yield a sealed inorganic oxide layer having between 1 and 3% nitrogen atom concentration in the first 10 nm top layer of the inorganic film. The method comprises at least a treatment step wherein said substrate with the inorganic oxide layer is treated in a plasma, such as an atmospheric plasma, more in particular an atmospheric pressure glow discharge plasma that is generated in a treatment space formed between at least two electrodes, by applying an electrical power from a power supply to the at least two electrodes, resulting in the treatment space in a high frequency electromagnetic field. Said treatment step e.g. lasts for less than 10 minutes at a temperature below 150° C., during which the treatment space being filled with a gas composition comprising a nitrogen compound such as $N_2$ (nitrogen) or $NH_3$ (ammonia) or NO or a combination thereof.

In another embodiment besides the above mentioned Nitrogen-based molecules, the gas composition may in addition contain a small amount of $H_2$ (hydrogen) gas, which may influence the plasma and barrier properties advantageously.

As a result of the treatment the inorganic oxide layer becomes sealed and gains a barrier improvement of a factor 1000, which was an unforeseen and surprising effect.

The method is preferably practiced on a flexible substrate with an inorganic oxide layer having a pore size of 0.1 to 20 volume %, e.g. 0.3 to 10 volume %. A variety of methods are possible for the provision of said substrate, which may be a sputtering method, an ion plating method, and a vacuum evaporation method. Alternatively, the inorganic oxide film can be formed by application of a precursor solution, that is, a wet deposition. In the latter case, the above-mentioned inorganic oxide layer may also be pretreated by ultraviolet light irradiation prior to exposing to plasma.

The inorganic oxide film substantially is, for example, a thin layer containing a silicon oxide, titanium oxide, aluminum oxide, film containing ITO and the like. The inorganic oxide film thickness may vary between 10 and 1000 nm. Examplary ranges may be between 15 and 100 nm.

In an embodiment the inorganic oxide film is prepared by exposing a flexible polymeric substrate to an atmospheric plasma deposition apparatus using a precursor as disclosed in EP 1 917 842 by applicant and which is hereby incorporated as reference. Preferred precursors which may be used for forming an inorganic oxide layer on a flexible substrate by using an atmospheric plasma as described in WO 2009 104 957 are TEOS, HMDSO, TPOT, TEOT, TMA, TEA.

The flexible substrate may be any kind of polymeric film. In an exemplary embodiment PET or PEN film is used having a thickness of 50 to 200 µm.

Other examples of substrate which may be used are transparent sheets of ethylene vinyl acetate (EVA), of polyvinyl butyral (PVB), of polytetrafluoroethylene (PTFE), perfluoroalcoxy resins (PFA), i.e., copolymers of tetrafluoroethylene and perfluoroalkyl vinyl ether, tetafluoroethylene-hexafluoropropylene copolymers (FEP), tetrafluoroethylene-perfluoroalkyl vinyl ether-hexafluoro-propylene copolymers (EPE), tetrafluoroethylene-ethylene or propylenecopolymers (ETFE), polychlorotrifluoroethylene resins (PCTFE), ethylene-chlorotrifluoroethylene copolymers (ECTFE), vinylidene fluoride resins (PVDF), and polyvinyl fluorides (PVF) or coextruded sheets from polyester with EVA, polycarbonate, polyolefin, polyurethane, liquid crystal polymer, aclar, aluminum, of sputtered aluminum oxide polyester, sputtered silicon oxide or silicon nitride polyester, sputtered aluminum oxide polycarbonate, and sputtered silicon oxide or silicon nitride polycarbonate.

SHORT DESCRIPTION OF THE FIGURES

The present invention will be discussed in more detail below, using a number of exemplary embodiments, with reference to the attached drawings, in which FIGS. 1a, 1b, and 1c show schematic views of a plasma generation device according the invention.

DETAILED DESCRIPTION OF THE EXAMPLES

The present invention will now be described in reference to exemplary embodiments of the invention.

Figure 1A:
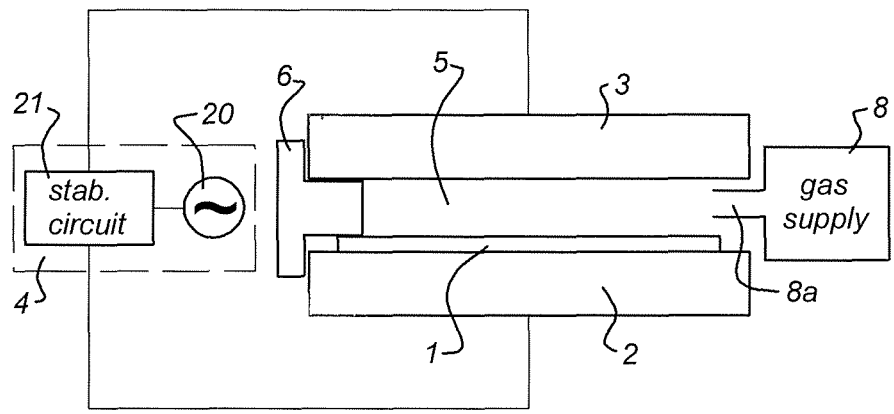

FIG. 1a shows a schematic view of a plasma apparatus with which the present invention may be practiced. A treatment space 5, which may be a treatment chamber within an enclosure (not shown in FIG. 1a), or a treatment space 5 with an open structure, comprises two electrodes 2, 3. In general the electrodes 2, 3 are provided with a dielectric barrier 2a, 3a (see FIG. 1b) in order to be able to generate and sustain a glow discharge at atmospheric pressure in the treatment space. In the embodiment shown, the electrodes 2, 3 are planar electrodes, and the treatment space 5 is a rectangular space. A side tab 6 is provided to close off the treatment space 5 on one side.

However, other forms of the electrodes 2, 3 and of the gap or treatment space 5 are possible, e.g. as part of a cylindrical arrangement of the plasma treatment apparatus. E.g., the treatment space may be cylindrical, or elliptic, or have another form adapted to treat a specific type of substrate 1. Both electrodes 2, 3 may have the same configuration being flat orientated (as shown in FIG. 1a) or both being roll-electrodes (as shown in FIG. 1c). Also different configurations may be applied using a roll electrode and a flat or cylinder segment shaped electrode opposing each other. In further embodiments, the electrodes may be multi-segment electrodes. Embodiments using more than two electrodes are also imaginable.

In general the atmospheric pressure plasma is generated between the two electrodes 2, 3 in the treatment space 5. Alternatively a plurality of electrodes 2, 3 is provided. In case the electrodes 2, 3 have a surface area which is at least as big as the substrate 1, the substrate 1 can be fixed in the treatment space 5 between the two electrodes 2, 3.

Figure 1B:
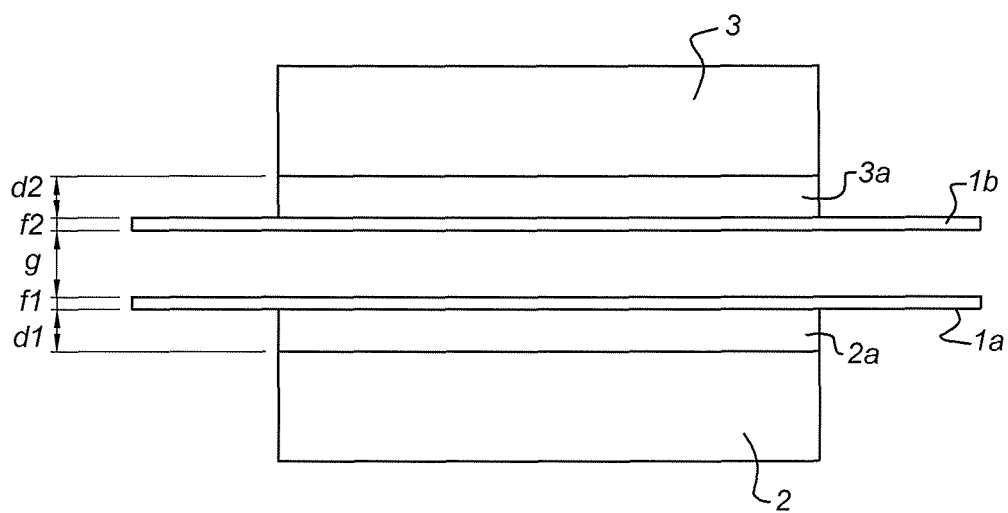
Figure 1C:
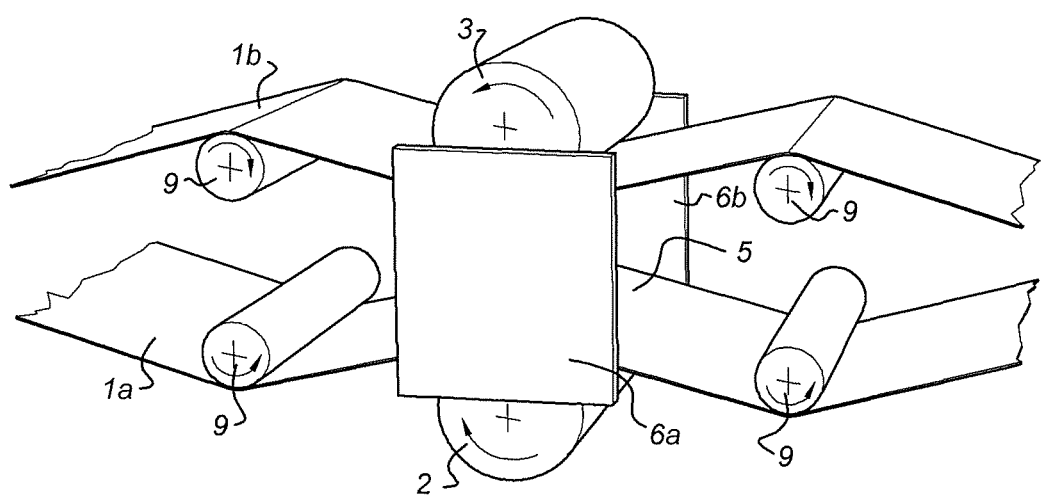

FIG. 1b shows a variant wherein two substrates 1a, 1b are treated simultaneously. In this alternative embodiment, not one substrate 1 but two substrates (1a, 1b) are positioned in a fixed way or moving at a certain speed in the treatment space 5 to utilise the gas supply even more efficiently. In FIG. 1c a further example of such an embodiment comprising two side tabs 6a, 6b and two substrates 1a, 1b is shown.

Both electrodes 2, 3 can be provided with a dielectric barrier layer 2a, 3a (see FIG. 1b). The dielectric layer 2a on the first electrode 2 has a thickness of d1 (mm), and the dielectric layer 3a on the second electrode 3 has a thickness of d2 (mm). In operation, the total dielectric distance d of the electrode configuration also includes the thickness of the (one or two) substrates 1a, 1b to be treated, indicated by f1 (mm) and f2 (mm). Thus, the total dielectric thickness of the dielectric barrier in the treatment space 5 between the at least two opposing electrodes (2, 3) equals d=d1+f1+f2+d2.

In a further embodiment, both d1 and d2 are 0 and the only dielectric material forming the dielectric barrier is the substrate 1a, 1b. In case of two substrates 1a and 1b, the total dielectric thickness in this case is d=f1+f2.

In still another embodiment both d1 and d2 are 0 and only one substrate 1 is used. In this embodiment the total dielectric thickness equals f1, so d=f1. Also in this embodiment in which electrode 3 is not covered with a dielectric material it is possible to obtain a stable atmospheric glow discharge plasma. The gap distance g in FIG. 1c indicates the smallest gap between the electrodes 2, 3 where an atmospheric pressure glow discharge plasma can exist in operation (i.e. in the treatment space 5), also called the free inter-electrode space. The dimensions of the electrodes 2, 3, dielectric barrier layers 2a, 3a, and gap g between the electrodes 2, 3, are predetermined in order to generate and sustain a glow discharge plasma at atmospheric pressure in the treatment space 5.

The dimensions of the electrodes 2, 3, dielectric barrier layers 2a, 3a, and gap g between the electrodes 2, 3 and the total dielectric distance (d) which is the total dielectric thickness of the dielectric barrier are controlled in a further embodiment, such that the product of gap distance and the total dielectric distance is arranged to be less than or equal to 1.0 mm$^2$ or even more preferred less than 0.5 mm$^2$ as disclosed in WO 2009/104 957 by applicant and is hereby incorporated as reference.

In case the substrate 1 is larger than the electrode area, the substrate 1 may be moved through the treatment space 5, e.g. at a linear speed using a roll-to-roll configuration, an example of which is shown in the embodiment of FIG. 1c. The substrates 1a, 1b are guided in close contact with the roller shaped (roll) electrodes 2, 3, using guiding rollers 9. A roll-electrode is e.g. implemented as a cylinder shaped electrode, mounted to allow rotation in operation e.g. using a mounting shaft or bearings. Such a roll-electrode may be freely rotating, or may be driven at a certain angular speed, e.g. using well known controller and drive units. The side tabs 6a, 6b are positioned at the roller end faces, thereby creating a closed off treatment space 5 between the electrodes 2, 3.

The electrodes 2, 3 are connected to a power supply 4, which is arranged to provide electrical power to the electrodes for generating the atmospheric (glow discharge) plasma.

The power supply can be a power supply providing a wide range of frequencies for example f=10 kHz-30 MHz.

Very good results can be obtained by using an atmospheric pressure glow discharge (APGD) plasma. Until recently these plasma's suffered from a bad stability, but using the stabilization circuits as for example described in U.S. Pat. No. 6,774,569, EP 1 383 359, EP 1 547 123 and EP 1 626 613 (which are incorporated herein by reference), very stable APG plasma's can be obtained. In general these plasma's are stabilized by a stabilization circuit 21 (as shown FIG. 1a) counteracting local instabilities in the plasma. Using the stabilization circuit 21 in combination with the AC power source 20 in the power supply 4 for the plasma generating apparatus results in a controlled and stable plasma, without streamers, filamentary discharges or other imperfections.

In the plasma treatment apparatus a gas supply device 8 may be arranged for the substrate treatment in order to direct the gas for the nitridation step towards an inner region of the substrate to be processed. The supply device 8 also acts as the main carrier gas supply. A carrier gas may be used such as Argon, Helium, etc., to form the plasma, as an additive or mixture to reduce the breakdown voltage.

A gas supply inlet 8a may be used to direct the gas into the treatment space 5 as shown in EP 2 226 832 by applicant and hereby incorporated as reference. The gas supply device 8 may be provided with storage, supply and mixing components as known to the skilled person.

The gas directed to the treatment space for the nitration step is essentially consisting of $N_2$ (nitrogen) or $NH_3$ (ammonia) or NO or combination thereof. In further embodiments the gas composition may consist besides the presence of $N_2$ (nitrogen) or $NH_3$ (ammonia) or NO or combination thereof a small amount of $H_2$.

The total amount of gas supplied to the substrate for the nitridation step is in the range of 1 to 30 slm.

Further the temperature in the treatment space 5 during the nitridation step is preferably below 150° C. and even preferably below 100° C.; the time of plasma treatment is preferably below the 10 minutes, preferably below 5 and even more preferably below 2 minutes. Excellent results have been found using at most 60 seconds of plasma treatment. As a result excellent barriers can be prepared at very mild conditions i.e. at atmospheric pressure at low temperature and high speed giving high economical value.

After the nitridation a substrate remains having a thin inorganic oxide film having a low N-atom concentration amount between 2 and 3%.

The nitrogen concentration is determined by X-ray Photoelectron Spectroscopy (XPS), using Amicon Electron Spectroscopy for Chemical Analysis (ESCA) equipment manufactured by Kratos.

EXAMPLES

Water vapour transmission rate (WVTR) of a typical 50 nm inorganic silicon oxide layer on a PEN 100 μm sheet film may change remarkably going from about 2 to about 0.002 g/m$^2$*day and typical barrier improvement factors after the plasma treatment is 400, 500 or 1000, which is an unforeseen and surprising effect. Barrier properties for such thin layers of comparable quality have previously only been reported for thin layers (about 50 nm) prepared by ALD (Atomic Layer Deposition) in a plasma process which is much less efficient and takes much more time as each atomic layer formed in an ALD cycle comprises 4 different steps.

WVTR is determined using a Mocon Aquatran Model 1 which uses a coloumetric cell (electrochemical cell) with a minimum detection limit of $5*10^{-4}$ g/m$^2$*day. This method provides a more sensitive and accurate permeability evaluation than the permeation measurement by using IR absorption. All measurements were done at 40° C./90% RH.

The free pore volume of the inorganic oxides was determined using the Lorentz-Lorenz equations by measuring the optical density difference of the material. Optical density difference was measured using a Woollam Spectroscopic Ellipsometer equipped with an vacuum chamber and heating stage.

Several samples (rolls) were prepared by depositing PEN (100 μm thick) or PET (100 μm thick) using an atmospheric pressure glow discharge plasma apparatus as disclosed in WO 2009 104 957 in a treatment space using a plasma power of 600 W, an excitation energy of 200 kHz and a gas composition (95% $N_2$/5% $O_2$) using different precursors (HMDSO/TEOS) resulting in the following 12 examples all having 50 nm inorganic oxide (Silicon oxide) layer.

TABLE 1

|  | Substrate | Precursor | Pore (vol. %) |
|---|---|---|---|
| Example 1-4 | PEN | HMDSO | 0.4~3 |
| Example 5-8 | PET | HMDSO | 0.3~2 |
| Example 9-12 | PET | TEOS | 0.3~3 |

Typical WVTR of the PET samples after deposition is 5 g/m2*day and for PEN the WVTR is 2 g/m2*day. These WVTR values are similar to the values of the bare polymer film.

As next step a part of the 12 examples were treated using the same atmospheric pressure plasma apparatus (APGD) as described in WO 2009 104 957 using a plasma power of 300 W, an excitation energy of 200 kHz however as gas composition of
1) 100% $N_2$ (10 slm) or 2) 95% $N_2$+5% $NH_3$ (10 slm) or 3) 98% $N_2$+2% NO (10 slm) or 4) 90% $N_2$+10% $H_2$ (10 slm). The nitridation step was done in 60 seconds at a temperature of 90° C.

Figure 2:
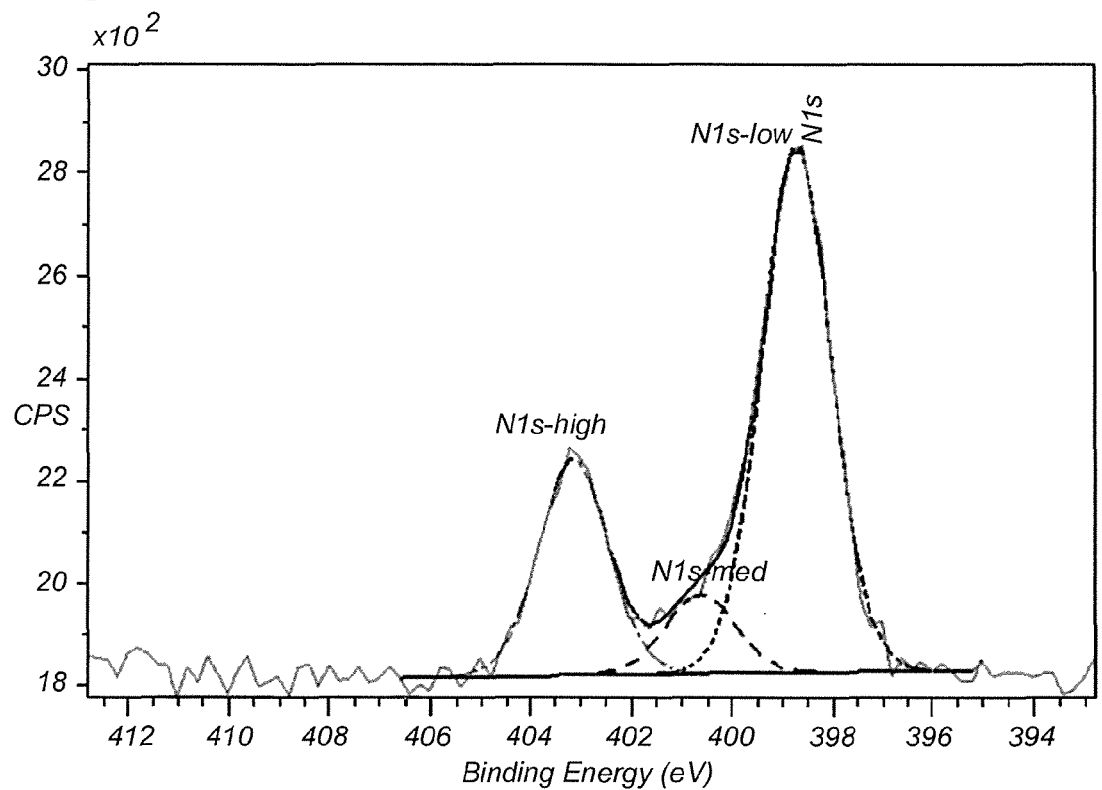
FIG. 2 shows the Electron Spectroscopy for Chemical Analysis (ESCA) or X-ray Photoelectron Spectroscopy (XPS) result of the top surface of an embodiment after an atmospheric pressure glow discharge nitridation treatment.

FIG. 2 shows N 1s signal of example 1 before and after the APGD nitridation step (post-treatment).

Figure 3:
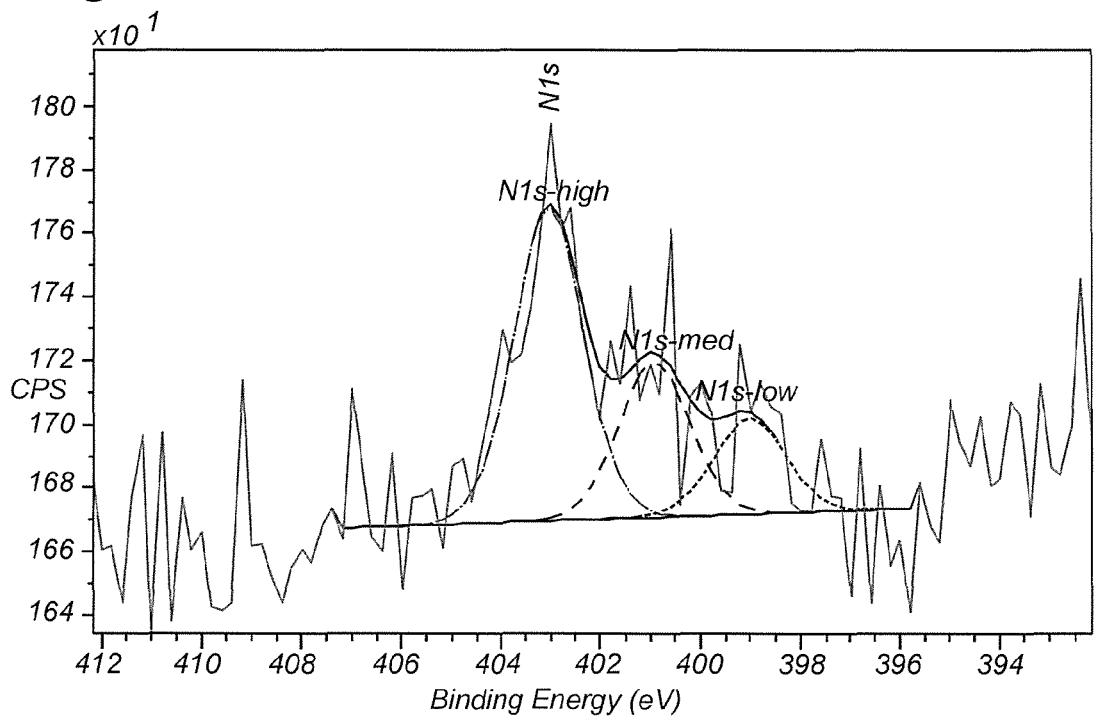
FIG. 3 shows the ESCA (XPS) result of the top surface of a corona $N_2$ treatment of example 1.

Another part of the same 12 examples were treated using a Low frequency (LF) dielectric barrier discharge (DBD) corona plasma using Softal corona unit type VTG 3005 (corona discharge treatment) equipment under the same gas compositions 1-4 described as above. FIG. 3 shows the ESCA (XPS) result of the top surface of the corona $N_2$ treatment.

Table 2 shows the WVTR (in g/m$^2$*day) and barrier improvement factor (BIF) results for the 12 examples treated under the APGD or the corona treatment as nitidation step. The nitrogen atom concentration was determined on the examples after the APGD post-treatment.

Although in all cases an improvement of the barrier performance is observed the best results are obtained (even with a barrier improvement factor of about 1000) by using a high frequency APG discharge for the nitridation step.

TABLE 2

|  | Gas | APGD WVTR@ (g/m$^2$ * day) | APGD BIF | APGD N %(*) | Corona WVTR | Corona BIF |
|---|---|---|---|---|---|---|
| Example 1 | $N_2$ | 0.003 | 666 | 1.3 | 1.0 | 2 |
| Example 2 | $N_2$/$NH_3$ | <0.002 | >1000 | 2.9 | 0.5 | 4 |
| Example 3 | $N_2$/NO | 0.005 | 400 | 1.1 | 1.2 | 2 |
| Example 4 | $N_2$/$H_2$ | 0.003 | 666 | 1.6 | 0.8 | 2.5 |
| Example 5 | $N_2$ | <0.002 | >2500 | 2.2 | 3 | 1.7 |
| Example 6 | $N_2$/$NH_3$ | <0.002 | >2500 | 2.7 | 1.6 | 3 |
| Example 7 | $N_2$/NO | 0.005 | 1000 | 1.8 | 3.9 | 1.3 |
| Example 8 | $N_2$/$H_2$ | <0.002 | >2500 | 2.1 | 2.0 | 2.5 |
| Example 9 | $N_2$ | <0.002 | >2500 | 2.5 | 3.1 | 1.6 |
| Example 10 | $N_2$/$NH_3$ | <0.002 | >2500 | 2.8 | 2.0 | 2.5 |
| Example 11 | $N_2$/NO | 0.006 | 833 | 1.4 | 3.5 | 1.4 |
| Example 12 | $N_2$/$H_2$ | <0.002 | >2500 | 0.9 | 2.1 | 2.4 |

(*)XPS reveals that as a result of the nitridation step a distinct low energy N1s peak appears which is attributed to N—Si3 bonding.
(@)background signal has not been subtracted; as back ground signal is in the order of about 0.002 the WVTR of examples 2, 5, 6, 8, 9, 10, 12 are in fact lower than 0.002 which as been denoted as <0.002.

The invention claimed is:

1. A method for manufacturing a barrier layer on a substrate, the method comprising:
providing a substrate with an inorganic oxide layer having a pore volume between 0.3 and 10 vol. %;
treating said substrate with an inorganic oxide layer in a glow discharge plasma, said plasma being generated by at least two electrodes in a treatment space formed between said two electrodes, said treatment space also being provided with a gas comprising Nitrogen compounds; and
the treating of the substrate in said treatment space is done at a temperature below 150° C.

2. The method according to claim 1, wherein the treatment of the substrate is done until a barrier with a top layer comprising between 1 to 3% Nitrogen-atom concentration is formed.

3. The method according to claim 1, wherein the gas comprising Nitrogen compounds, comprises $N_2$ (nitrogen) and/or $NH_3$ (ammonia) and/or NO.

4. The method according to claim 1, wherein the gas comprising Nitrogen compounds has a pressure between 0.1 and 10 atmosphere.

5. The method according to claim 1, wherein the treating of the substrate in said treatment space is done for a duration of less than 10 minutes.

6. The method according to claim 1, wherein the substrate is a flexible substrate.

7. The method according to claim 6, wherein the electrodes are roll-electrodes, and the flexible layer is moved through the treatment space at a linear speed.

8. The method according to claim 1, wherein the inorganic oxide layer of the provided substrate is a silicon-oxide layer.

9. The method according to claim 1, wherein the top layer is between 5 and 15 nm thick.

10. The method according to claim 1, wherein (i) the treatment of the substrate is done until a barrier with a top layer comprising between 1 to 3% Nitrogen-atom concentration is formed; (ii) the gas comprising Nitrogen compounds, comprises $N_2$ (nitrogen) and/or $NH_3$ (ammonia) and/or NO; (iii) the gas comprising Nitrogen compounds has a pressure between 0.1 and 10 atmosphere; and (iv) the treating of the substrate in said treatment space is done for a duration of less than 2 minutes.

11. The method according to claim 1, wherein (i) the treatment of the substrate is done until a barrier with a top layer comprising between 1 to 3% Nitrogen-atom concentration is formed; (ii) the gas comprising Nitrogen compounds, comprises $N_2$ (nitrogen) and/or $NH_3$ (ammonia) and/or NO; (iii) the gas comprising Nitrogen compounds has a pressure between 0.6 and 2 atmosphere; and (iv) the treating of the substrate in said treatment space is done for a duration of less than 10 minutes.

12. The method according to claim 6, wherein (i) the treatment of the substrate is done until a barrier with a top layer comprising between 1 to 3% Nitrogen-atom concentration is formed; (ii) the gas comprising Nitrogen compounds, comprises $N_2$ (nitrogen) and/or $NH_3$ (ammonia) and/or NO; (iii) the gas comprising Nitrogen compounds has a pressure between 0.1 and 10 atmosphere; and (iv) the treating of the substrate in said treatment space is done for a duration of less than 10 minutes.

13. The method according to claim 6, wherein (i) the treatment of the substrate is done until a barrier with a top layer comprising between 1 to 3% Nitrogen-atom concentration is formed; (ii) the gas comprising Nitrogen compounds, comprises $N_2$ (nitrogen) and/or $NH_3$ (ammonia) and/or NO; (iii) the gas comprising Nitrogen compounds has a pressure between 0.6 and 2 atmosphere; and (iv) the treating of the substrate in said treatment space is done for a duration of less than 10 minutes.

14. The method according to claim 12, wherein the inorganic oxide layer of the provided substrate is a silicon-oxide layer and wherein the top layer is between 5 and 15 nm thick.

15. The method according to claim 13, wherein the inorganic oxide layer of the provided substrate is a silicon-oxide layer and wherein the top layer is between 5 and 15 nm thick.

16. The substrate according to claim 15, wherein (i) the inorganic oxide layer of the provided substrate is a silicon-oxide layer; (ii) the substrate is a flexible polymeric substrate; and (iii) the top layer is between 7 and 12 nm thick.

\* \* \* \* \*